United States Patent
Jin et al.

(10) Patent No.: US 9,511,582 B2
(45) Date of Patent: Dec. 6, 2016

(54) INK FORMULATIONS FOR FLEXOGRAPHIC PRINTING OF HIGH-RESOLUTION CONDUCTING PATTERNS

(71) Applicant: Eastman Kodak Company, Rochester, NY (US)

(72) Inventors: Danliang Jin, The Woodlands, TX (US); Ed S. Ramakrishnan, The Woodlands, TX (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/418,184

(22) PCT Filed: Mar. 12, 2013

(86) PCT No.: PCT/US2013/030617
§ 371 (c)(1),
(2) Date: Jan. 29, 2015

(87) PCT Pub. No.: WO2014/021941
PCT Pub. Date: Feb. 6, 2014

(65) Prior Publication Data
US 2015/0165755 A1 Jun. 18, 2015

Related U.S. Application Data

(60) Provisional application No. 61/677,058, filed on Jul. 30, 2012.

(51) Int. Cl.
*B41F 5/24* (2006.01)
*H05K 3/18* (2006.01)
(Continued)

(52) U.S. Cl.
CPC ............... *B41F 5/24* (2013.01); *C09D 11/101* (2013.01); *C09D 11/52* (2013.01); *C23C 18/1608* (2013.01); *C23C 18/204* (2013.01); *C23C 18/206* (2013.01); *C23C 18/2066* (2013.01); *C23C 18/30* (2013.01); *C23C 18/32* (2013.01); *C23C 18/38* (2013.01); *C23C 18/42* (2013.01);
(Continued)

(58) Field of Classification Search
CPC .......... B41F 5/24; C09D 11/52; C09D 5/24; C09D 7/1258; C09D 7/1266; C09D 7/1275
See application file for complete search history.

(56) References Cited

U.S. PATENT DOCUMENTS 4,420,527 A * 12/1983 Conley .................. B29C 35/10
359/620
4,830,880 A 5/1989 Okubi et al.
(Continued)

FOREIGN PATENT DOCUMENTS

WO    WO2014021941    2/2014

OTHER PUBLICATIONS

PCT/US2013/030617 International Search Report and Written Opinion dated Jun. 25, 2013 (12 pgs.).

*Primary Examiner* — David Banh
(74) *Attorney, Agent, or Firm* — Kevin E. Spaulding (57) ABSTRACT

Systems and methods disclosed herein are directed towards flexographic printing of microscopic high resolution conductive patterns (HRCP). These HRCP may be printed using one or more formulations for high polarity and stable viscosity inks for use in the flexographic printing process. The inks may be water permeable, UV curable, and configured to resist loss of integrity when exposed to water and atmospheric moisture.

7 Claims, 3 Drawing Sheets

(51) Int. Cl.
*C09D 11/101* (2014.01)
*C09D 11/52* (2014.01)
*C23C 18/16* (2006.01)
*C23C 18/20* (2006.01)
*C23C 18/30* (2006.01)
*C23C 18/32* (2006.01)
*C23C 18/38* (2006.01)
*C23C 18/42* (2006.01)
*C23C 18/52* (2006.01)

(52) U.S. Cl.
CPC ............... *C23C 18/52* (2013.01); *H05K 3/182* (2013.01); *G06F 2203/04103* (2013.01); *H05K 2203/0709* (2013.01); *H05K 2203/1545* (2013.01); *H05K 2203/1572* (2013.01)

(56) References Cited

U.S. PATENT DOCUMENTS

| | | | |
|---|---|---|---|
| 5,424,009 A | 6/1995 | Asrar | |
| 6,375,313 B1 | 4/2002 | Adavikolanu et al. | |
| 6,399,278 B1* | 6/2002 | Leach | G03F 7/027 430/284.1 |
| 6,719,422 B2 | 4/2004 | Wu et al. | |
| 2003/0228748 A1* | 12/2003 | Nelson | H05K 3/12 438/612 |
| 2005/0019533 A1* | 1/2005 | Mossbrook | B41M 7/0045 428/204 |
| 2005/0153078 A1 | 7/2005 | Bentley et al. | |
| 2006/0134442 A1 | 6/2006 | Sugiyama et al. | |
| 2009/0042150 A1* | 2/2009 | Yamada | B32B 27/00 430/432 |
| 2009/0090462 A1* | 4/2009 | Kato | H05K 9/0096 156/249 |
| 2009/0093609 A1* | 4/2009 | Shibutani | C08F 216/38 528/246 |
| 2009/0181227 A1 | 7/2009 | Hazlewood et al. | |
| 2009/0233237 A1* | 9/2009 | Yoshiki | H05K 3/106 430/311 |
| 2010/0171064 A1* | 7/2010 | Shim | B22F 1/025 252/62.55 |
| 2010/0224317 A1* | 9/2010 | Kawamura | B41M 3/006 156/277 |
| 2010/0227078 A1* | 9/2010 | Mori | H05K 3/182 427/535 |
| 2010/0323102 A1 | 12/2010 | Chopra et al. | |
| 2011/0063388 A1* | 3/2011 | Loccufier | C07C 217/22 347/100 |
| 2011/0069130 A1* | 3/2011 | Loccufier | C07C 217/22 347/102 |
| 2011/0187798 A1 | 8/2011 | Rogers et al. | |
| 2011/0226511 A1 | 9/2011 | Matsushita | |
| 2011/0240482 A1* | 10/2011 | Satou | C23C 18/1608 205/164 |
| 2013/0221107 A1* | 8/2013 | Wilkinson | G06K 1/121 235/488 |
| 2015/0030984 A1* | 1/2015 | Ramakrishnan | G03F 7/2022 430/306 |
| 2015/0101745 A1* | 4/2015 | Ramakrishnan | B41F 5/24 156/250 |
| 2015/0107474 A1* | 4/2015 | Ramakrishnan | C09D 11/10 101/483 |
| 2015/0125596 A1* | 5/2015 | Ramakrishnan | H01Q 7/00 427/125 |
| 2015/0231874 A1* | 8/2015 | Jin | B41F 5/24 101/483 |

* cited by examiner

INK FORMULATIONS FOR FLEXOGRAPHIC PRINTING OF HIGH-RESOLUTION CONDUCTING PATTERNS

CROSS-REFERENCE TO RELATED APPLICATIONS

The present application is a national stage of and claims priority under 35 U.S.C. §371 to International Patent Application Ser. No. PCT/US2013/030617, filed on Mar. 12, 2013, entitled "INK FORMULATIONS FOR FLEXOGRAPHIC PRINTING OF HIGHRESOLUTION CONDUCTING PATTERNS," by Danliang JIN, et al., which claims the benefit of and priority under 35 U.S.C. §119 to U.S. Provisional Patent Application No. 61/677,058, filed Jul. 30, 2012, entitled "INK FORMULATIONS FOR FLEXOGRAPHIC PRINTING OF HIGHRESOLUTION CONDUCTING PATTERNS," by Danlaing JIN, et al., which are both herein incorporated by reference in their entirety for all purposes.

FIELD OF THE DISCLOSURE

This disclosure relates generally to printed electronics, specifically to ink formulations that may be of use in the manufacture of printed electronics such as touch screen displays and antenna.

BACKGROUND

Conventional methods of manufacturing transparent thin film antennas comprise screen printing employing a thick film with conductive paste of copper/silver, resulting in wide (>100 µm) and tall (>10 µm) lines. Photolithography and etching processes are used for thinner and narrower features. These processes may not be capable of printing smaller, higher resolution patterns, such as those used in various electronic devices and related applications involving high resolution conductive patterns.

BRIEF SUMMARY

In an embodiment, a method of flexographically manufacturing a high resolution conductive pattern comprises: flexographically printing a first pattern on a substrate using an ink, wherein the first pattern comprises a plurality of lines, and wherein each line of the plurality of lines is between 1 micron-25 microns wide; wherein the ink comprises: a water-compatible polymer; and a plating catalyst; curing the first pattern, by least partially solidifying the printed pattern; and plating the first pattern to form a conductive pattern.

In an alternate embodiment, a method of flexographically manufacturing high resolution conducting patterns comprises: flexographically printing a pattern on a substrate using an ink, wherein the pattern comprises a plurality of lines, and wherein each line of the plurality of lines is between 1 micron-25 microns wide; wherein the ink comprises: a water-compatible polymer; and a plating catalyst. The embodiment further comprising: curing the printed pattern by at least partially solidifying the printed pattern; and plating the printed pattern to form a high resolution conducting pattern.

In an alternate embodiment, a method of flexographically manufacturing high resolution conducting patterns comprising: flexographically printing at least one pattern on a substrate using an ink, wherein the pattern comprises a plurality of lines, and wherein each line of the plurality of lines is from 1 micron-25 microns wide; and wherein the ink comprises: at least one polymer; at least one plating catalyst, wherein the plating catalyst comprises Tetrakis (triphenylphosphine) palladium (0). The embodiment further comprising: curing the at least one printed pattern, wherein curing comprises at least partially solidifying the printed pattern; and plating the at least one printed pattern, wherein plating the at least one pattern forms a conductive pattern.

Further features and characteristics will become apparent from a consideration of the ensuing description and the accompanying drawings.

BRIEF DESCRIPTION OF THE DRAWINGS

For a detailed description of exemplary embodiments of the invention, reference will now be made to the accompanying drawings in which.

DETAILED DESCRIPTION

The disclosures of US20060134442 entitled "Method for electroless plating," U.S. Pat. No. 4,830,880 entitled "Formation of catalytic metal nuclei for electroless plating," WO/1995/032318 entitled "CATALYTIC, CROSSLINKED POLYMERIC FILMS FOR ELECTROLESS DEPOSITION OF METAL," U.S. Pat. No. 5,424,009 entitled "Catalytic, cross-linked polymeric films for electroless deposition of metal," U.S. Pat. No. 6,719,422 entitled "Curable inkjet printable ink compositions," US20050153078 entitled "Formation of solid layers on substrates," US20090181227 entitled "Formation of Conductive Metal Regions on Substrates," may be relevant to the disclosure herein.

A High Resolution Pattern (HRP) is any conductive or non-conductive material patterned, deposited or printed onto a substrate surface. Accordingly, a High Resolution Conducting Pattern, (HRCP) is any conductive material patterned on a substrate surface as described herein. HRCPs may be manufactured using a flexographic printing process. Flexography is a form of a rotary web letterpress where relief plates are mounted on to a printing cylinder, for example, with double-sided adhesive. These relief plates, which may also be referred to as a master plate or a flexoplate, may be used in conjunction with fast drying, low viscosity solvent, and ink fed from anilox or other two roller inking system. The anilox roll may be a cylinder used to provide a measured, controlled amount of ink to a printing plate. The ink may be, for example, water-based, solvent-based, or solvent-less ultraviolet (UV)-curable inks. In one example, a first roller transfers ink from an ink pan or a metering system to a meter roller or anilox roll. The ink is metered to a uniform thickness when it is transferred from the anilox roller to a plate cylinder in order to have a uniform distribution when the ink is ultimately transferred to the substrate. When the substrate moves through the roll-to-roll handling system from the plate cylinder to the impression cylinder, the impression cylinder applies pressure to the plate cylinder which transfers the image on to the relief plate to the substrate. In some embodiments, there may be a fountain roller instead of the plate cylinder and a doctor blade may be used to improve the distribution of ink across the roller.

Flexographic plates may be made from, for example, plastic, rubber, or a photopolymer which may also be referred to as a UV-sensitive polymer. The plates may be made by laser engraving, photomechanical, or photochemical methods. The plates may be purchased or made in accordance with any known method. The preferred flexographic process may be set up as a stack type where one or more stacks of printing stations are arranged vertically on each side of the press frame and each stack has its own plate cylinder which prints using one type of ink and the setup may allow for printing on one or both sides of a substrate. In another embodiment, a central impression cylinder may be used which uses a single impression cylinder mounted in the press frame. As the substrate enters the press, it is in contact with the impression cylinder and the appropriate pattern is printed. Alternatively, an inline flexographic printing process may be utilized in which the printing stations are arranged in a horizontal line and are driven by a common line shaft. In this example, the printing stations may be coupled to curing stations, cutters, folders, or other post-printing processing equipment. Other configurations of the flexographic process may be utilized as well.

In an embodiment, flexoplate sleeves may be used, for example, in an in-the-round (ITR) imaging process. In an ITR process, the photopolymer plate material is processed on a sleeve that will be loaded on to the press, in contrast with the method discussed above where a flat plate may be mounted to a printing cylinder, which may also be referred to as a conventional plate cylinder. The flexosleeve may be a continuous sleeve of a photopolymer with a laser ablation mask coating disposed on a surface. In another example, individual pieces of photopolymer may be mounted on a base sleeve with tape and then imaged and processed in the same manner as the sleeve with the laser ablation mask discussed above. Flexosleeves may be used in several ways, for example, as carrier rolls for imaged, flat, plates mounted on the surface of the carrier rolls, or as sleeve surfaces that have been directly engraved (in-the-round) with an image. In the example where a sleeve acts solely as a carrier role, printing plates with engraved images may be mounted to the sleeves, which are then installed into the print stations on cylinders. These pre-mounted plates may reduce changeover time since the sleeves can be stored with the plates already mounted to the sleeves. Sleeves are made from various materials, including thermoplastic composites, thermoset composites, and nickel, and may or may not be reinforced with fiber to resist cracking and splitting. Long-run, reusable sleeves that incorporate a foam or cushion base are used for very high-quality printing. In some embodiments, disposable "thin" sleeves, without foam or cushioning, may be used. Flexographic printing processes may use anilox rolls for ink transfer as a means of metering the ink so that the ink prints the desired pattern with clear, uniform features free of clumping or smearing.

As used herein, the patterned material has a width or lateral measurement in the plane of the substrate surface of less than about 50 µm. It is appreciated that an HRP may also be described in some embodiments as a High Resolution Conductive Pattern (HRCP) even if it is not plated with a conductive material because it is to be plated with a conductive material or because plating may not be needed to achieve the desired properties of the pattern. As such, one or more implementations herein are configurable to permit the electroless plating process to increase efficiency. In some embodiments, increased permeability of the ink may increase the degree of interaction, for example, the surface area available for reaction, between the metal particles in the ink of a pattern and the metal ions that exist in the plating solution. This increased degree of interaction may improve the speed, consistency, and/or quality of the plating process. This may be done by increasing the permeability of the ink through additives. In certain applications, the interaction between metal particles dissociated from catalyst additives in the printed patterns utilizing commercially available inks formulations are surface- or substrate-limited. More specifically, the dissociated metal ions in the plating process are limited to the surfaces in contact with the aqueous plating solution. As such, the present ink formulation is configured to increase the ink's permeability to water by additive incorporation, for example, by using a polymer that is highly water-compatible or soluble which may be referred to as "hydrophilic" and/or "high-polarity."

In addition, a reduced variance of viscosity during the printing process may allow longer uninterrupted productions runs having a higher quality or higher resolution pattern, and a commensurate reduction in operator oversight, monitoring, and control. Viscosity, as used herein may refer to a fluid's internal resistance to flow. Further, as used herein the term may be the measure of resistance to deformation in shear, tensile stress, or both. The viscosity of an ink used in a flexographic printing process or other printing process to form microscopic patterns comprising lines from 1 micron-30 microns in width may be controlled in order to ensure that the pattern is printed properly and that the pattern can maintain its shape in the time, however small, between printing and the next step such as curing which may be done for dissociative purposes and/or to solidify the pattern in place for subsequent processing.

The term "printing process" may be used to refer to any process by which any number of inks is applied to at least one surface of a substrate. Likewise, the term flexographic printing process refers to any printing process in which a flexible relief plate, on a cylinder is used to apply ink on a substrate. The relief plate may also be referred to in some embodiments as a master plate, which may refer to any roll carrying a predefined pattern used to print on any substrate. In certain instance a master plate may refer to an anilox roll. An anilox roll may be a cylinder used to provide a measured amount of ink to a printing plate. Alternatively, to any roller with a recessed or pattern on its surface used to transfer ink onto a flexoplate which may be any metallic, polymeric, or composite, generally cylindrical drum having recesses or dimples in its circumferential surface for flexographic printing. It is appreciated that, regardless of the pattern of recesses or dimples on the anilox roll used to transfer ink to the flexoplate, the flexoplate pattern and not the anilox pattern is transferred to the substrate.

An ink as discussed herein may be a combination of monomers, oligomers or polymers, metal elements, metal elements complexes, or organometallics in a solid or liquid state that may be discretely applied over a substrate surface. Further, as used herein, an ink may refer to any material used in a printing process, for example a flexographic printing process, which may be deposited on a surface or substrate. An ink may be any state of a liquid, such as a mixture, suspension, or colloid, without limitation. In certain instance, ink may refer to solids or liquids deposited on a surface.

The present disclosure comprises a number of ink formulations which may be of use in the printing of electronics that use microscopic printed patterns, for example, in a flexographic printing process. These formulations have properties that may contribute to uniform printing and plating. More specifically, the formulations described herein may exhibit an enhanced degree of permeability to water at the time of writing (printing the pattern) as compared to conventional inks. In some embodiments, the inks discussed herein may exhibit a lesser degree of viscosity variation over time under operating conditions as compared to conventional inks. The term permeability refers to a material property to permit anther fluid to permeate or pass through the material. For example, the ability to pass a fluid substance through a solid material or a printed material or a printed, cured material on a substrate. Increased permeability may be desired for ease of processing, including but not limited to shortened time and/or increased quality and consistency of, for example, an electroless plating process. The inks discussed herein may be used in the flexographic printing of flexible printed electronics or other applications where high resolution patterns (where each pattern line may be 1 micron-30 microns wide) are desired. The inks comprise a mixture of at least one catalyst with at least one monomer, polymer, or oligomer as well as any number of additives. The term additive may refer to any component of an ink that may or may not modify any number of its properties.

Generally, the inks are deposited on a substrate using a plurality of printing processes, such as but not limited to a flexographic printing process. The deposited ink forms a pattern that may comprise a plurality of lines. The printed pattern may be cured in one or more steps at one or more curing stations such that at least some of the plating catalyst is dissociated into metal particles. Curing as used herein refers to the process of drying, solidifying or fixing any coating or ink imprint, previously applied, on a substrate. Curing may be performed by applying radiation, heat, or both to change at least one physical or chemical property of a material such as the ink. Further, curing may include to the process of chemical or physical changes in a fluid under irradiation.

In an embodiment, the ink's plating catalyst is at a concentration from 0.1 wt. %-25 wt. %, preferably from 0.5 wt. %-10 wt. %. In some embodiments, the larger the width of the line to be printed, the smaller the percent catalyst is that is needed and/or used in the ink. The plating process may occur more slowly with smaller lines, at the same concentration, because the wider lines plate faster due to an increased surface area. The inks disclosed herein may comprise a number of additives as well as a polymer base, for example, a high-polarity polymer base where "high polarity" refers to the hydrophilic properties of that polymer base. The ink may comprise at least one plating catalyst in addition to other additives such as monomers, polymers, and oligomers. In some embodiments, a photoinitiator may be used as well. In some examples, the polymer is a polymer that is a water-compatible polymer that enhances the permeability of the ink, this may be referred to as a high-polarity polymer or a water-compatible polymer. In some embodiments, a high polarity polymer or a water-compatible polymer may be used without further additives to impact plating or viscosity. In some embodiments, the polymer system used in the ink may not require a photo initiator.

In an embodiment, if a photoinitiator is used, the photoinitiator may be beacetophenone, anisoin, anthraquinone, anthraquinone-2-sulfonic acid, sodium salt monohydrate, (benzene) tricarbonylchromium, benzil, benzoin, benzoin ethyl ether, benzoin isobutyl ether, benzoin methyl ether, benzophenone, benzophenone/1-hydroxycyclohexyl phenyl ketone, 50/50 blend, 3,3',4,4'-benzophenonetetracarboxylic dianhydride, 4-benzoylbiphenyl, 2-benzyl-2-(dimethylamino)-4'-morpholinobutyrophenone, 4,4'-bis(diethylamino)benzophenone, 4,4'-bis(dimethylamino)benzophenone, camphorquinone, 2-chlorothioxanthen-9-one, (cumene)cyclopentadienyliron(ii) hexafluorophosphate, dibenzosuberenone, 2,2-diethoxyacetophenone, 4,4'-dihydroxybenzophenone, 2,2-dimethoxy-2-phenylacetophenone, 4-(dimethylamino)benzophenone, 4,4'-dimethylbenzil, 2,5-dimethylbenzophenone, 3,4-dimethylbenzophenone, diphenyl(2,4,6-trimethylbenzoyl)phosphine oxide/2-hydroxy-2-methylpropiophenone, 50/50 blend, 4'-ethoxyacetophenone, 2-ethylanthraquinone, ferrocene, 3'-hydroxyacetophenone, 4'-hydroxyacetophenone, 3-hydroxybenzophenone, 4-hydroxybenzophenone, 1-hydroxycyclohexyl phenyl ketone, 2-hydroxy-2-methylpropiophenone, 2-methylbenzophenone, 3-methylbenzophenone, methybenzoylformate, 2-methyl-4'-(methylthio)-2-morpholinopropiophenone, phenanthrenequinone, 4'-phenoxyacetophenone, thioxanthen-9-one, or combinations thereof.

An ink additive may be used to increase the permeability of the ink to water in order to increase the surface area that comes in contact with the aqueous plating solution. Modifying and controlling ink permeability may enable a controlled, improved interaction between the metal resulting from the dissociation of catalysts in the printed patterns and the metal ions in the electroless plating process. This may result in a more uniform plating of the pattern, in some examples at a reduced cost and/or in a reduced timeframe as compared to conventional inks. Additionally, controlling permeability may limit the dissolution, washing away, or peeling of the ink disposed on the substrate during the flexographic printing process. This may lead to an increase in shelf life which may be desirable depending on the end use for the printed patterns. An increased shelf life may be desirable if, for example, if the printed component is used in a larger system or device wherein part of the manufacturing process takes place in a different location or at a different time because the printed components would be able to maintain their dimensional integrity while being stored and/or transported.

A plating catalyst may have the ability to catalyze oxidation of the reductant that is formulated in an electroless solution such as that used for electroless plating. Multiple metals may be considered as good catalyst for oxidation of all of the reducing agents that have been employed for electroless deposition. In one example, palladium (Pd) is considered to be a sufficient catalyst. Palladium can be used in the form of a zero valent state metal such as the metal itself or as tetrakis(triphenylphosphine)-palladium (0). In addition, palladium redox systems such as stannous chloride-palladium chloride, or palladium-organic compounds such as palladium (II) acetate, palladium 2,4-pentanedionate which can be reduced after UV exposure or thermal process may also be used. Further, in some embodiments, copper (Cu), nickel (Ni), cobalt (Co), silver (Ag), platinum (Pt), gold (Au), and erbium (Er) or combinations thereof can also be used as catalysts for certain electroless plating systems.

In an embodiment, a plurality of nano-fibers such as silicon nano-fibers or nanoparticles may be added to an ink in order to increase and/or control the viscosity. The ink viscosity may be controlled/adjusted in order to maintain control not only while printing but to ensure that printed patterns maintain their shape and dimensions in the intermediate period between printing and plating. In an embodiment, the plurality of nano-fibers or nanoparticles may comprise between 0.5 wt. %-25 wt. % of the ink composition. Even if this time gap is relatively small, a more viscous ink may be desirable so that the microscopic shape, which may have dimensions as small as 1 micron, is maintained so that it can be properly cured into position for subsequent plating. The term "polarity" may be used to describe the permeability and/or interaction with water of a particular ink or ink component or additive. In general, commercially available inks for flexographic printing processes have low polarity, and may be considered hydrophobic. Generally, the hydrophobic inks interact poorly within an aqueous environment, for example the aqueous protocol associated with electroless plating methods. In some cases, the use hydrophilic inks may be preferred, that is, an ink with higher polarity and/or hydrophilic properties that may have increased permeability and, as such, increased available surface area for interaction with a plating bath.

Generally, an example of the inks as described herein may have a formulation or formulations that may comprise a combination of components chosen from the following: Bisphenol A diacrylate, Polyethylene glycol diacrylate, Hydroxyethyl methacrylate monomer; Pentaerythritol tetraacrylate, photoinitiators such as 1-Hydroxy-cyclohexyl-phenyl-ketone, 2,2-Dimethyl-1,2-diphenylethan-1-one, and a catalyst such as palladium acetate. In certain formulations, the concentration of each of the above components of the present formulation may have a concentration comprising between about 0.1 percent by weight (wt. %) to about 70 wt. %; and alternatively, from about 3 wt. % to about 50 wt. %. In another example, the concentration of any or all components may be between about 3 wt. % and about 40 wt. %. In further formulations each component may have a concentration greater than about 3.5 wt. %. In alternate formulations the concentration is below about 30 wt. % for each component in an ink formulation. Further, in one embodiment, at least one component may be excluded or have a concentration of 0 wt. %.

Other formulations for inks used to flexographically print patterns comprising a plurality of lines where each line is between 1 micron-25 microns wide may include a combination of components chosen from Poly(vinyl alcohol), N-methyl-4-(4'-formylstyryl) pyridinium methosulfate acetal solution, Polyvinylpyrrolidone, Palladium acetate, and 1-methoxy-2-propanol, without limitation. In certain formulations, the concentration of each of the components of the present formulation, may have a concentration comprising between about 0.1 percent by weight (wt. %) to about 70 wt. %; and alternatively, from about 1 wt. % to about 70 wt. % and alternatively, between about 2 wt. % and about 69 wt. %. In further formulations each component may have a concentration greater than about 2 wt. %. In alternate formulations the concentration is below about 70 wt. % for each component in an ink formulation. Further, in a formulation at least one component may be excluded or have a concentration of 0 wt. %. Additionally, in some formulations any of the components may have a solids concentration or a solids content of below about 30 wt. %; alternatively below about 25 wt. %; and in certain instance, a solids content below about 15 wt. %.

Additionally, in certain formulations the components themselves may have alternate formulations or may be alternate but similar or analogous compounds, without limitation. In a non-limiting exemplary formulation the palladium acetate may be substituted by any other organometallic compounds, salt, or conjugate of palladium, including but not limited to palladium oxalate. Further, the organometallic salt may be substituted with any or Group VIII metal salt. Additionally, the acrylate compositions of certain inks may have different chemical structures, branching, and side chains without limitation.

Figure 1A:
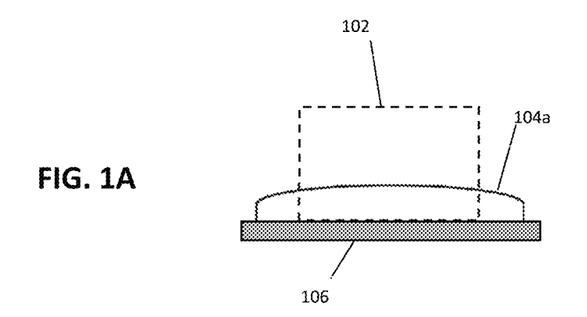
FIGS. 1A-1C are illustrations cross-sections of patterns made inks with varying viscosities according to embodiments of the present disclosure.
Figure 1B:
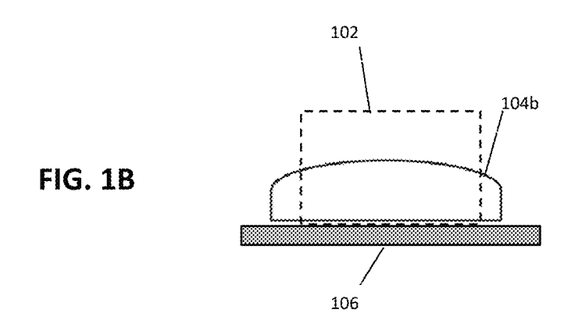
Figure 1C:
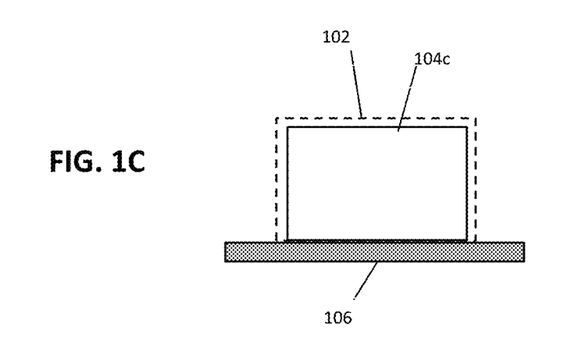

FIGS. 1A-1C illustrate cross-sections of patterns made inks with varying viscosities. As discussed above, a pattern comprising a plurality of lines that may be used for an RF antenna, a touch screen sensor, or other application that uses high resolution conductive microscopic patterns may be printed on a substrate. The ink used to print this pattern may have increased permeability as compared to conventional inks. In an embodiment, an excess of permeability additive and/or a lack of or an insufficient amount of viscosity additive may impact the printed shape of the pattern. If the ink is not viscous enough to hold its shape upon printing, either because there is an excess of the component used to increase permeability and/or because of the absence of a component to enhance the viscosity, the pattern may spread or otherwise deform prior to curing.

FIG. 1A depicts desired cross-section 102 of a line from a plurality of lines of a printed pattern and actual line cross section 104a disposed on substrate 106. This substrate may be an optically isotropic transparent film such as cellulose triacetate, acrylic, or similar polymers, or may be paper, glass, ceramic, metallic, or other substrate as suitable for the application and processing. This figure may depict what happens if the ink is not viscous enough to hold its shape. It is appreciated that, if an ink cannot hold its shape, then the HRCP for a particular application may not hold the desired shape and therefore may not be suitable for the end application. This creates scrap product that may not be reworkable, and therefore may add time and cost associated with scrap in a roll-to-roll process. An ink may not be able to hold its shape because its viscosity is too low, this may be due to an increased permeability of the ink or because of other factors involved in its formulation. The viscosity, as discussed below, may be altered and/or increased by the addition of nano-fibers and/or nanoparticles. In some embodiments, the measurement of a nanoparticle of a plurality of nanoparticles used in the ink may be from 10 nm to 5 microns or higher, depending on the line width/feature size requirement. Nanoparticles of materials include oxides of zinc (Zn), titanium (Ti), cesium (Ce), aluminum (Al), or others. In an embodiment, each nano-fiber of the plurality of nano-fibers may have a diameter of 20 nm to 200 nm, and a length of at least 2 micron-10 microns, and each nanoparticle of the plurality of nanoparticles may have a diameter of 20 nm to 200 nm. It is appreciated that the diameter and the length of the nano-fiber and/or the diameter of the nanoparticles may be selected to be less than the width of the each printed pattern lines.

In some embodiments, colloidal forms of oxides may be used as nanoparticles such as colloidal particles of Cerium oxide (Ceria), silica, tin oxide, yttrium oxide (yttria), zinc oxide, zirconium dioxide (zirconia). In an embodiment, the addition of nanoparticles or colloids or fibers modifies the viscosity and enables control of print characteristics on the ink. Such addition also assists in improving the adhesion strength of plated copper to the substrate. These forms of oxides may be mixed with organometallic palladium (Pd) or aqueous solutions of Pd compounds. In another embodiment, PVA (Polyvinyl alcohol) may be used as thickener for aqueous forms of the catalyst to achieve the desired viscosity and a fully formed pattern as discussed below in FIG. 1C.

FIG. 1B depicts the desired cross-section 102 of a line from a plurality of lines of a printed pattern and actual line cross section 104b disposed on substrate 106. The ink used to print the cross-section 104b may comprise some nano-fiber or nanoparticle content, or may comprise an additive that is soluble in water but may be less so or in less quantity in the ink than that in FIG. 1A, but may not comprise enough to fully form the desired pattern. FIG. 1C depicts the desired cross-section 102 of a line from a plurality of lines of a printed pattern and actual line cross-section 104c disposed on substrate 106. While illustrative, FIG. 1C is intended to show the impact of viscosity, whether controlled by a thickening additive such as a nano-fiber, nanoparticle, or PVA, or by a permeable base or additive, or by both, FIG. 1C illustrates how the desired cross section 102 is correctly filled by an ink. It is appreciated that, while the cross-sections shown in FIGS. 1A-1C are rectangular in shape, other cross-sectional shapes may be desired including square, polygonal, circular, trapezoidal, triangular, and combinations thereof. In this example, the ink used to print the pattern shown by a line cross-section 104c comprises a weight percent of nano-fibers and/or nanoparticles that enables the viscosity of the ink to be such that the lines are printed in the desired cross-sectional geometry. In this example, the lines may be fully formed in the desired pattern and can hold the shape until further processing such as curing occurs, this curing may occur microseconds, minutes, hours, or longer after printing depending upon the composition of the ink. In another example, the polarity of the polymer used may be high enough to provide the desired permeability with no or a reduced amount of nano-fibers and/or nanoparticles and may hold the desired pattern shape after printing for the desired time according to the process parameters and setup as in FIG. 1C. In either example, the cross-section is fully formed to the desired specifications indicated by the desired cross section 102.

Figure 2:
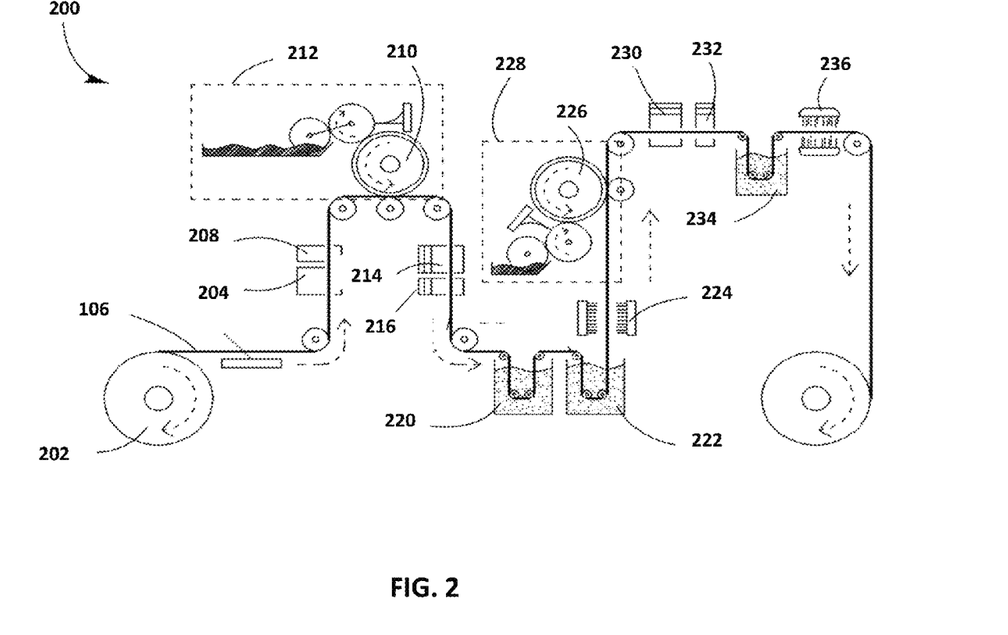
FIG. 2 is an illustration of a system for implementing embodiments of the present disclosure.
Figure 3:
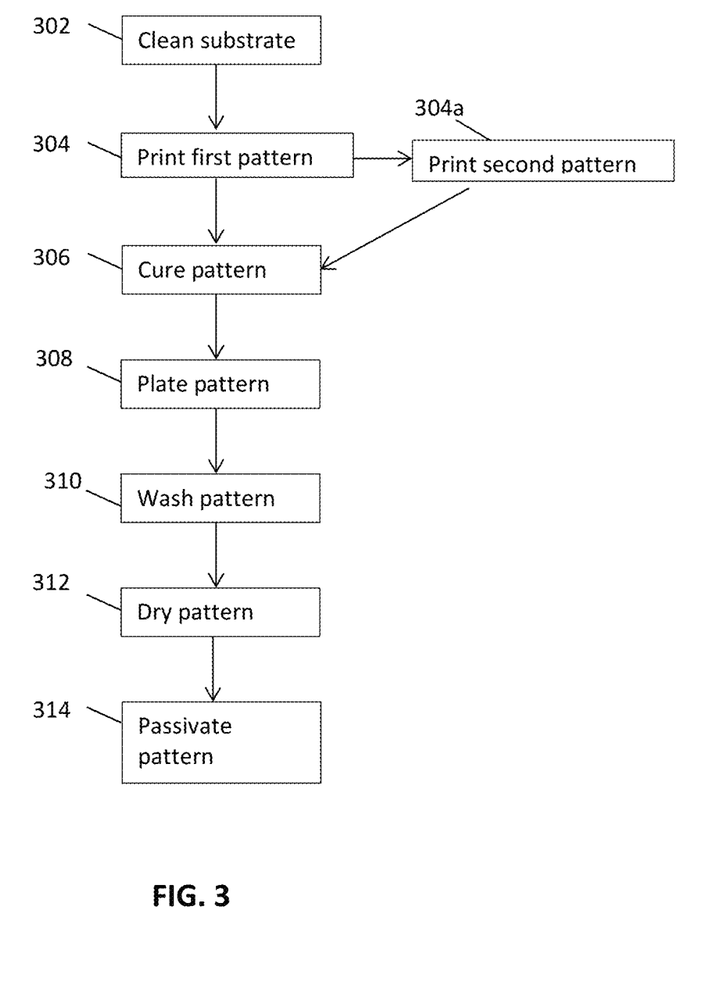
FIG. 3 is a flow chart of a method for implementing embodiments of the present disclosure.

FIG. 2 is an illustration of a system for implementing embodiments of the present disclosure. FIG. 3 is a flow chart of a method for implementing embodiments of the present disclosure. FIG. 2 illustrates roll-to-roll handling method 200 used to fabricate a high resolution conductive pattern that may be used in a variety of applications including touch screen sensors and RF antenna. In an embodiment, an elongated, flexible, thin substrate 106 is placed on an unwind roll 202. Transparent substrates such as PET (polyethylene terephthalate), polyester and polycarbonate may be used as the substrate 106. The thickness of the substrate 106 may be small enough to avoid excessive stress during flexing of the touch sensor. Conversely, the thickness of the substrate 106 should not be so small as to jeopardize the continuity of this layer or its material properties during the manufacturing process. Preferably, a thickness between 1 micron and 1 millimeter may be suitable. The substrate 106 is transferred, for example, via any known roll to roll handling method from an unwind roll 202 to be cleaned at block 302. The cleaning at block 302 may comprise one or more cleaning stations. In some embodiments, a first cleaning station 204 may be used alone and in alternate embodiments a second cleaning station 208 may be used as well. Alignment of the substrate 106 with the roll-to-roll process may be performed because the alignment may affect the locations, dimension, and quality of printed patterns that could negatively impact the end product, regardless of whether the end product is a printed substrate or a product that is further processed as described below. In one embodiment, a positioning cable 206 may be used to maintain proper alignment of the features, in other embodiments any known means may be used for this purpose. In some embodiments the first cleaning station 204 comprises a high electric field ozone generator. The ozone generated is used to remove impurities such as oils or grease from the substrate 106.

In some embodiments, the substrate 106 may go through a second cleaning station 208. In an embodiment, the second cleaning system 208 may comprise a web cleaner. A web cleaner is any device used in web manufacturing to remove particles from a web or substrate. After cleaning, the substrate 106 goes through a first printing at block 304 where a first pattern is printed at a first print station comprising a master plate 210 and a high precision metering system 212 that comprises an ink pan containing ink formulated with the desired viscosity and permeability as discussed above. During the printing of the first pattern at block 304, a microscopic pattern may be printed on one of the sides of the substrate 106. The microscopic pattern may comprise a plurality of lines where each line is between 1 micron-25 microns wide and from 1 micron-100 microns in height as-printed and may be printed by the master plate 210 using UV curable ink that may have a viscosity between 10 and 15,000 cps. In an embodiment (not pictured), a plurality of rolls may be used to print the pattern and the plurality of rolls may use different inks, similar inks, or the same ink. The ink type used may depend on the geometry and complexity of the features of the pattern because the pattern may comprise a plurality of lines with different thicknesses, connecting features, geometries of connecting features, and cross-sectional geometries.

The amount of ink transferred from the master plate 210 to the substrate 106 when the first pattern is printed at block 304 may be regulated by the high precision metering system 212. The amount of ink transferred may depend on the speed of the process, ink composition, and the shape and dimensions of the plurality of lines that comprise the pattern. The speed of the machine may vary from 20 feet per minute (fpm) to 750 fpm, while 50 fpm to 200 fpm may be suitable for some applications. The ink may contain plating catalysts and photoinitiators. The first pattern printing at block 304 may be followed by a curing at block 306 at a first curing station 214. The curing at block 306 may comprise ultraviolet light curing with target intensity from about 0.5 mW/cm$^2$ to about 50 mW/cm$^2$, and a wavelength from about 280 nm to about 480 nm. In some embodiments, the curing at block 306 may comprise oven heating at a second curing station 216 that applies heat within a temperature range of about 20° C. to about 85° C. After the curing at block 306, a plurality of patterned lines formed on top of the substrate 106 when the pattern is printed at block 304 at the first printing station is solidified or partially solidified, for example, in preparation for further processing such as plating or for transport or storage prior to use or further processing.

With a printed microscopic pattern on one side, the substrate 106 may be exposed to electroless plating at block 308 at an electroless plating station 220 where a layer of conductive material is deposited on the microscopic pattern. This may be accomplished by submerging the substrate 106 into an electroless plating bath at the plating station 220 in a tank that contains copper or other conductive material in a liquid state at a temperature range between 20° C.-90° C., with 80° C. being applied in some embodiments. The conductive material may comprise at least one of copper (Cu), silver (Ag), gold (Au), nickel (Ni), tin (Sn), erbium (Er), platinum (Pt), and Palladium (Pd), or combinations thereof. The deposition rate may be about 10-100 nanometers (0.01 microns-0.1 microns) per minute and deposits the conductive material to a thickness of about 1 nm-100,000 nm (0.001 microns-100 microns), depending on the speed of the web and according to the application. This electroless plating process does not require the application of an electrical current and it only plates the patterned areas containing plating catalysts that were previously activated by the exposure to UV radiation during the curing process. The plating bath may include strong reducing agents such as borohydride or hypophosphite which cause the plating to occur. The plating thickness resulting from electroless plating may be more uniform compared to electroplating due to the absence of electric fields. Although electroless plating may be more time consuming than electrolytic plating, electroless plating may be well suited for parts with complex geometries and/or many fine features such as those that may be present in a high resolution conducting pattern.

In some embodiments, following the electroless plating at block 308, the substrate 106 may be washed at block 310 at a wash station 222. The substrate 106 may be washed at block 310 by being submerged into a cleaning tank at wash station 222 that contains water at room temperature and are then dried at block 312 at drying station 224 in which the substrate 106 is dried by the application of air at room temperature. In another embodiment (not pictured in FIG. 2), the substrate may be passivated at block 314 by, for example, pattern spray after drying at block 312 to prevent any dangerous or undesired chemical reaction between the conductive materials and water.

In some embodiments, the drying at the drying station 224 may be followed by the creation another (second) pattern. In alternate embodiments, the second pattern may be formed concurrently with the first pattern in various combinations of printing and plating wherein both patterns may be printed at the same time at block 304, cured at the same time at block 306, and plated at the same time at block 308, or wherein a first pattern is at least one of printed, cured, and plated prior to the second pattern's formation and/or processing. The second pattern may be a second plurality of lines on a different substrate, on the opposite side of the substrate where the first pattern was printed at block 304 at printing station 210, or may be printed adjacent to or on top of the first pattern. The geometry and location of the second pattern may depend on the end application of the conductive pattern. The second pattern is printed at block 304a at a second printing station comprising a second master plate 226 and a second high precision metering system 228 using UV curable ink that may have a viscosity between 200 and 10000 cps. This ink may be the same as or different from the ink used to print the first pattern at printing station 210. The amount of ink transferred from second master plate 226 to the substrate 106 is regulated by another high precision metering system (the second printing station) 228 and may depend on the speed of the process, ink composition and patterns shape and dimension. Following printing the second pattern at the second printing station 228, the substrate 106 may go through a second curing similar to curing at block 306 in FIG. 3. The second cure may be performed at the first curing station 214 or may be performed at second curing station 230 depending upon the equipment configuration. The second curing may comprise ultraviolet light curing with intensity from about 0.5 mW/cm$^2$ to 20 mW/cm$^2$ and/or oven drying 232 at a temperature between 20° C. and 150° C. Subsequently, the substrate 106 may go through a second washing at a second wash station 234, using known conventional washing techniques, and the substrate 106 may be dried using air at room temperature in at a second drying at a drying station 236. When at least one conductive pattern has been printed and plated, the pattern may be passivated at block 314. In some embodiments, if more than one pattern is printed on the same substrate as the first pattern or on a different substrate, the patterns may be assembled, for example, using adhesive.

Exemplary inks that may be used in the system of FIG. 2 and the method of FIG. 3 may include a UV curable ink which may be of use in the flexographic printing of HRCPs comprises commercially available components including a plating catalyst additive such as palladium acetate, or other organometallic compound of palladium such as palladium oxalate. In some embodiments, this plating catalyst may be present in the ink from 1 wt. % to 15 wt. %, where the UV curable ink may also comprise any combination of 1 wt. % to 3 wt. % silica fibers and up to 20 wt. % water-permeable polymer which may also be referred to as the permeability additive, water-compatible polymer, or a high-polarity polymer. The addition of nanoparticles and/or nano-fibers such as silica fibers may increase the viscosity of the UV curable ink and the monomer additive may decrease the viscosity of the UV curable ink. In an embodiment, palladium chloride nanoparticles, or other nanoparticles as appropriate for the composition of the ink, may be used instead of or in addition to silica fibers or any nano-fiber. In an embodiment if palladium chloride is used in the ink, the plurality of fibers may be added to decrease the solubility and increase the viscosity. By controlling the viscosity through nano-fiber and/or nanoparticle addition, ink formulations such as disclosed herein may be able to be used, for example, in a flexographic printing process and/or for printing microscopic patterns, that may not have been able to be used without the viscosity control.

In some embodiments, the 1-Hydroxy-cyclohexyl-phenyl-ketone is supplied by Double Bond Chemicals under the brand name Double Cure 184, the 2,2-Dimethyl-1,2-diphenylethan-1-one is supplied by Double Bond Chemicals under the brand name Double Cure BDK; and the remaining components may be supplied by Sigma-Aldrich.

In the above embodiments, the ink is water permeable, UV curable, viscous enough to maintain its shape between printing and curing. In addition, the ink may not significantly dissolve, wash away, or peel when exposed to water. The ink may also have a higher polarity and a more stable viscosity as compared to water based inks or solvent based inks. This stability may lead to an increased shelf life which may be desirable if the original equipment manufacturer or a component manufacturer is involved in a portion of the manufacturing process and may therefore desire components such as printed substrates that can be shipped to and/or from the supplier/manufacturer without compromising the integrity of the pattern(s) on the substrates.

In an example embodiment, the ink comprises Bisphenol A diacrylate from 5 wt. %-80 wt. %, Polyethylene glycol diacrylate from 10 wt. %-80 wt. %, Hydroxyethyl methacrylate from 5 wt. %-50 wt. %, Pentaerythritol tetraacrylate from 5 wt. %-50 wt. %, 1-Hydroxy-cyclohexyl-phenyl-ketone 1 wt. %-10 wt. %, 2,2-Dimethyl-1,2-diphenylethan-1-one 1 wt. %-10 wt. %, and Palladium acetate 0.1 wt. %-20 wt. %.

In an embodiment, alternative organometallic salts may be incorporated herein, without changing the properties of the present formulations. More specifically, palladium acetate may be substituted for any palladium or Group VII metal salt.

In some embodiments, specific formulas may be desired for both their viscosity and permeability including:
Formula 1:
Bisphenol A diacrylate: 22.4 wt. %

Polyethylene glycol diacrylate: 22.4 wt. %
Hydroxyethyl methacrylate: 29.9%
Pentaerythritol tetraacrylate: 14.9%
1-Hydroxy-cyclohexyl-phenyl-ketone: 4.5 wt. %
2,2-Dimethyl-1,2-diphenylethan-1-one: 2.2 wt. %
Palladium acetate: 3.6 wt. %
Formula 2:
Poly(vinyl alcohol), N-methyl-4-(4'-formylstyryl) pyridinium methosulfate acetal
   solution (solid content 13.3 wt. %): 26.3 wt. %
   Polyvinylpyrrolidone: 4.1 wt. %
   Palladium acetate: 2.1 wt. %
   1-methoxy-2-propanol: 67.5 wt. %

The formulations disclosed herein have a formulation for the resistance to changes in viscosity under operational conditions. As such, the formulations are designed to reduce the required monitoring of process parameters in manufacturing processes where said inks could be of use. The inks exhibit an improved permeability, stability of viscosity, and polarity that may be used for any printing process including the flexographic printing of HRCPs.

While the preferred embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, the scope of protection is not limited by the description set out above, but is only limited by the claims which follow, that scope including all equivalents of the subject matter of the claims.

We claim:

1. A method of flexographically manufacturing a high resolution conductive pattern comprising:
   flexographically printing a first pattern on a substrate using an ink, wherein the first pattern includes a plurality of lines, and wherein each line of the plurality of lines is between 1 micron-25 microns wide;
   wherein the ink includes:
      a water-compatible polymer including Polyethylene glycol diacrylate;
      a plating catalyst;
      a photoinitiator including thioxanthen-9-one; and
      a plurality of nano-fibers;
   curing the first pattern, by least partially solidifying the printed pattern; and
   plating the first pattern to form a conductive pattern.

2. The method of claim 1, wherein the plating catalyst includes at least one of palladium acetate, palladium 2,4-pentanedionate, silver (Ag), platinum (Pt), gold (Au), and erbium (Er).

3. The method of claim 1, wherein the plating catalyst includes a plurality of nanoparticles, wherein each nanoparticle has a size between 10 nm-5 microns.

4. The method of claim 1, wherein each nano-fiber of the plurality of nano-fibers has a diameter of 20 nm to 200 nm, and a length of 2 micron to 10 microns.

5. A method of flexographically manufacturing a high resolution conductive pattern comprising:
   flexographically printing a first pattern on a substrate using an ink, wherein the first pattern includes a plurality of lines, and wherein each line of the plurality of lines is between 1 micron-25 microns wide;
   wherein the ink includes:
      a water-compatible polymer;
      a plating catalyst;
   curing the first pattern, by least partially solidifying the printed pattern; and
   plating the first pattern to form a conductive pattern;
   wherein the ink includes Bisphenol A diacrylate from 5 wt. %-80 wt. %, Polyethylene glycol diacrylate from 10 wt. %-80 wt. %, Hydroxyethyl methacrylate from 5 wt. %-50 wt. %, Pentaerythritol tetraacrylate from 5 wt. %-50 wt. %, 1-Hydroxy-cyclohexyl-phenyl-ketone 1 wt.%-10 wt. %, 2,2-Dimethyl-1,2-diphenylethan-1-one 1 wt. %-10 wt. %, and Palladium acetate 0.1 wt. %-20 wt. %.

6. The method of claim 1, wherein the first pattern is printed on a first side of the substrate and the method further includes printing a second pattern using the ink on at least one of the substrate on a side opposite the first side, adjacent to the first pattern on the first side of the substrate, or on a different substrate.

7. The method of claim 1, wherein plating includes electroless plating using at least one of copper (Cu), nickel (Ni), tin (Sn), gold (Au), silver (Ag), and erbium (Er).

* * * * *